United States Patent [19]

Ishihara et al.

[11] Patent Number: 5,278,784
[45] Date of Patent: Jan. 11, 1994

[54] NON-VOLATILE MEMORY

[75] Inventors: Hiroshi Ishihara; Norihiro Tokuyama, both of Tenri; Masaru Yuki, Fukuyama, all of Japan

[73] Assignee: Sharp Kabushiki Kaisha, Osaka, Japan

[21] Appl. No.: 981,851

[22] Filed: Nov. 24, 1992

[30] Foreign Application Priority Data

Jan. 20, 1992 [JP] Japan .................................. 4-007524

[51] Int. Cl.$^5$ ............................................. G11C 17/16
[52] U.S. Cl. ..................................... 365/96; 365/103; 365/104
[58] Field of Search ................ 365/94, 95, 96, 225.7, 365/103, 104, 105; 307/465, 465.1; 257/530, 529; 340/825.84

[56] References Cited

U.S. PATENT DOCUMENTS 4,943,538  7/1990  Mohsen et al. ........................ 437/52
4,970,686 11/1990  Naruke et al. ......................... 365/96

FOREIGN PATENT DOCUMENTS 48609    9/1986  Japan .................................... 257/529
63-22435 9/1988  Japan .

OTHER PUBLICATIONS

*IEDM88*, Hamdy et al: "Dielectric Based Antifuse for Logic and Memory ICs," pp. 786-789.

Primary Examiner—Eugene R. LaRoche
Assistant Examiner—Vu A. Le
Attorney, Agent, or Firm—Nixon & Vanderhye

[57] ABSTRACT

A non-volatile programmable memory having:
 a plurality of unit cells disposed therein, each of said unit cells including an anti-fuse that can write in data by electrically breaking down an insulating film, a select transistor individually connected to said anti-fuse, and a wiring connected to each anti-fuse; and
 an auxiliary transistor connected between mutually adjacent unit cells, said auxiliary transistor having a source region and a drain region respectively connected between said anti-fuse and said select transistor together incorporated in mutually adjacent unit cells.

2 Claims, 5 Drawing Sheets

A-A'

B-B'

C-C'

(a)

(b)

NON-VOLATILE MEMORY

BACKGROUND OF THE INVENTION

1. Field of the Invention

This invention relates to a non-volatile memory, and more particularly to a non-volatile memory programmable by applying a predetermined amount of programmed voltage to cause an insulation breakdown to allow said memory to irreversibly conduct electricity.

2. Description of the Prior Art

Conventional counterparts of non-volatile memories are constituted of cells each incorporating two devices; one transistor and one anti-fuse. As shown in FIG. 5 (a) and FIG. 5 (b), on a silicon substrate 31 having a device isolation insulating film 32, an activated region 31' and an oxide film 33 on said region, a gate electrode 34 acting as a word line, a source region 35 and a drain region 36 are formed to constitute together a transistor, which acts as a select transistor. On the drain region 36, a fuse insulating film 37 thinner in thickness than an oxide film in other regions is formed in the place of the oxide film 33. In addition, an electrode polysilicon layer 38 acting as a bit line is formed to overlay the silicon substrate 31 and the gate electrode 34. The fuse insulating film 37 and the electrode polysilicon layer 38 constitute an anti-fuse device. Energizing a select transistor and applying voltage to a preselected bit line causes an insulation breakdown in the fuse insulating film 37 of a preselected cell, thereby allowing the film to irreversibly conduct electricity.

When writing in memory contents onto the non-volatile memory, voltage is applied to a gate electrode 34 of the select transistor acting as a word line to energize the select transistor. Besides, energizing the polysilicon layer 38 acting as a bit line at a voltage higher than in reading memory contents causes an insulation breakdown in the fuse insulating film 37 to electrify a channel region of the select transistor from the bit line to the source region 35.

It is known that the larger the amount of electric current applied in writing in memory contents is, the smaller resistance the above conventional non-volatile memories have in reading them (See Dielectric Based on Anti-Fuse For Logic and Memory ICs (IEDM '88). Besides, in the above mentioned non-volatile memory, since the select transistor and the anti-fuse are connected in series in operation, the select transistor controls electric current both in reading and writing in memory contents.

The electric currents are represented by the following equation as a drain electric current;

$$I_D = \tfrac{1}{2} \cdot W/L \cdot M_{eff} \cdot C_{OM} (V_{GS} - V_{th})$$

wherein W represents a gate width, L a gate length, Meff mobility, $C_{OM}$ a gate capacity, $V_{GS}$ a gate voltage and $V_{th}$ threshold voltage. The equation designates that two methods are available for increasing the electric current conducting the non-volatile memory; one is to enlarge the gate width of the select transistor and the other is to shrink the gate length. However, enlarging the gate width demands a larger memory size while shrinking the gate length induces a reduction in dielectric strength in the select transistor. It naturally follows that a preferable type of the non-volatile memory cannot be easily embodied in the prior art.

SUMMARY OF THE INVENTION

This invention provides a non-volatile memory free from a reduction in dielectric strength, which device can decrease resistance generated in a cycle of reading and writing in memory contents without enlarging the memory size.

In other words, this invention provides a non-volatile programmable memory having: a plurality of unit cells disposed therein, each of said unit cells including an anti-fuse that can write in data by electrically breaking down an insulating film of the anti-fuse, a select transistor individually connected to said anti-fuse, and a wiring connected to each of anti-fuses; and an auxiliary transistor connected between mutually adjacent unit cells, said auxiliary transistor having a source region and a drain region respectively connected between said anti-fuses and said select transistors together incorporated in mutually adjacent unit cells.

BRIEF DESCRIPTION OF DRAWINGS

The non-volatile memory of this invention is detailed with respect to the drawings in which.

DETAILED DESCRIPTION OF THE PREFERRED EMBODIMENT

A non-volatile memory of the present invention will be detailed as follows by way of an embodiment with reference to the drawings.

Figure 1:
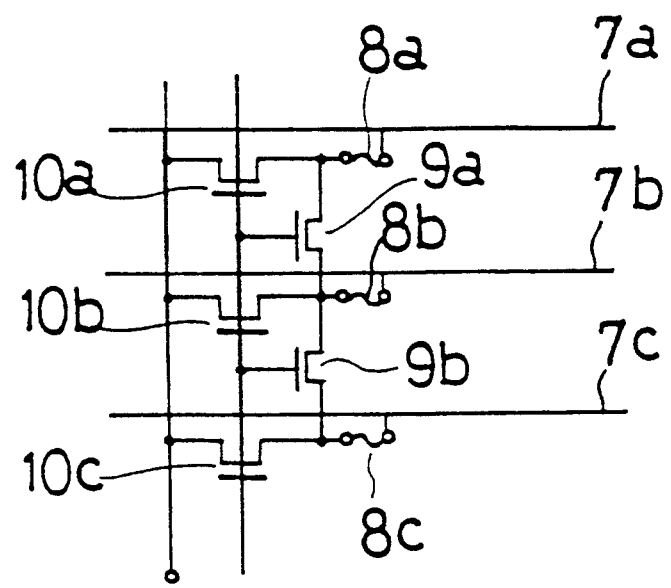
FIG. 1 is a view showing an equivalent circuit of a non-volatile memory of this invention.

Referring to FIG. 1, a non-volatile memory of this invention comprises a plurality of unit cells and a plurality of auxiliary transistors having a source region and a drain region, said plurality of unit cells including an anti-fuse, a select transistor connected to each of said anti-fuse, and a wiring connected to each of the anti-fuse, and said auxiliary transistor being connected between mutually adjacent unit cells. A source and a drain in each of said auxiliary transistors are connected respectively between said anti-fuses and said select transistors in said mutually adjacent cells. Besides, gate electrodes of the select transistor and of the auxiliary transistors are mutually connected.

In the non-volatile memory of this invention, a word line in a memory cell to which data is to be written is selected in writing in memory contents, and a bit line to be written in is energized. Such an operation process causes an insulation breakdown of a fuse insulating film for a selected memory cell, thereby electrifying the select transistor. In this process, setting the threshold voltage of the auxiliary transistor lower than the voltage applied at the gate electrode of the select transistor electrifies adjacent select transistors through the auxiliary transistor. Consequently, the ON-strate current passing through the select transistor ostensibly increases. In other words, resistance in reading memory contents are reduced by increasing the electric current in writing in memory contents. Incidentally, it is required that the memory cell adjacent write-in cell does not function simultaneously as a write-in cell or a reading cell. For example, with respect to FIG. 1, selecting a word line in a memory cell to be written and selecting a bit line 7b simultaneously causes an insulation breakdown of a fuse insulating film 8b. Consequently, the select transistor 10b is electrified and the select transistor 10a, 10c are also electrified through the auxiliary transistors 9a, 9b. However, the ON resistance ratio between the select transistor and the auxiliary transistor needs to be adjusted so that the difference between the electric potential on the drain side of the select transistors 10a and 10c and the counterpart on the side of the bit lines 7a, 7c is reduced to a level smaller than the insulation pressure resistance of the fuse insulating film. Besides, the threshold values in the auxiliary transistor need to be adjusted so that the auxiliary transistor is de-energized in reading memory contents.

Figure 5A:
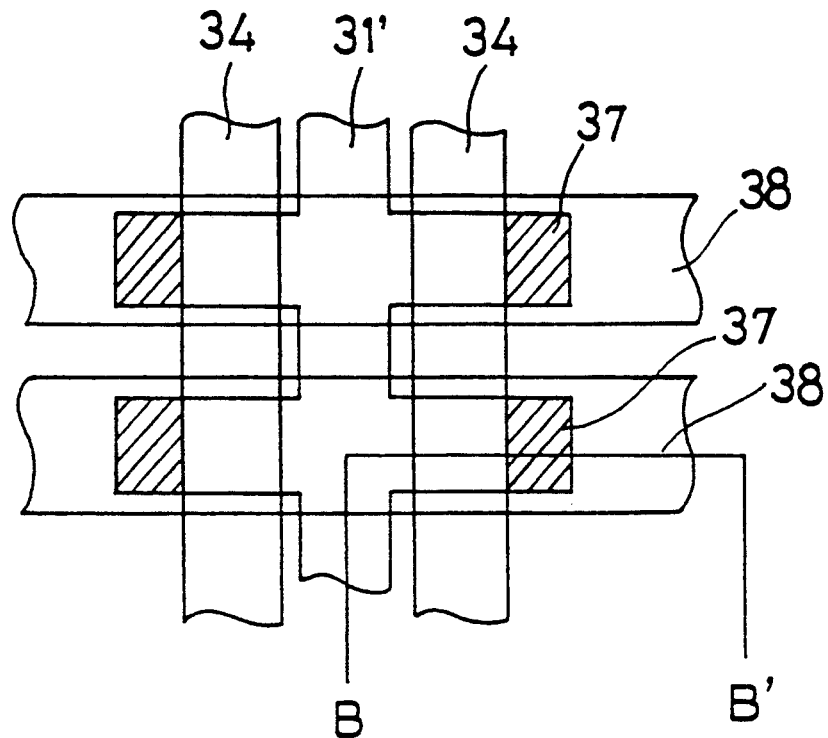
FIG. 5 (b) is a cross section taken along a B—B' line of FIG. 5 (a).
Figure 5B:
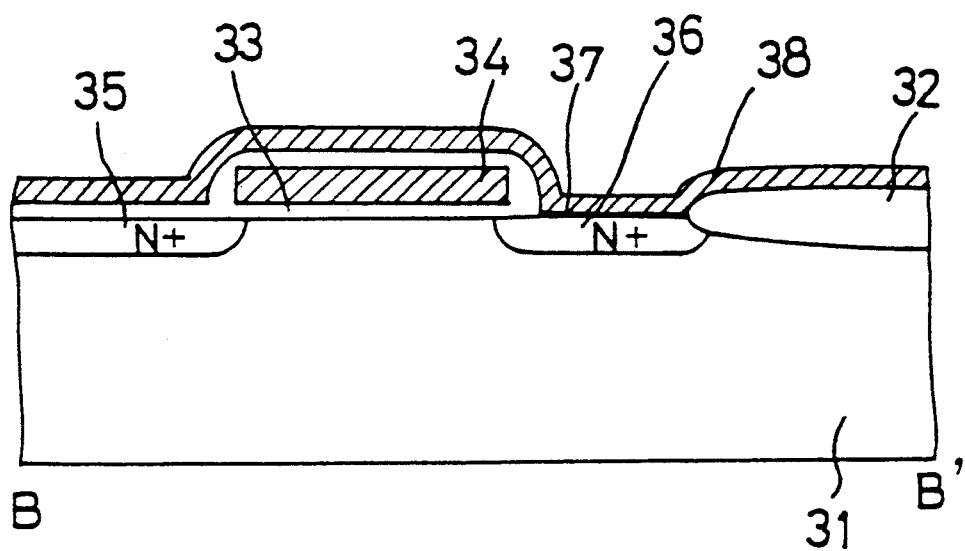

In the conventional structure of memories shown in FIG. 5 (a) and FIG. 5 (b), preferably, the provision of an auxiliary transistor similar to one used in this invention allows the electrification of the device isolation region between the bit lines (electrode polysilicon layer 38). Three concrete methods are available to attain this purpose; one is to demounte a channel stopper that constitutes the auxiliary transistor on the device isolation region or to control the threshold values of the auxiliary transistor by ion implantation while the other is to reduce the thickness of the insulating film constituting the auxiliary transistor in the device isolation region on an equality with the thickness of a gate insulating film in the select transistor.

This invention is detailed with reference to the drawings.

EMBODIMENT 1

Figure 2A:
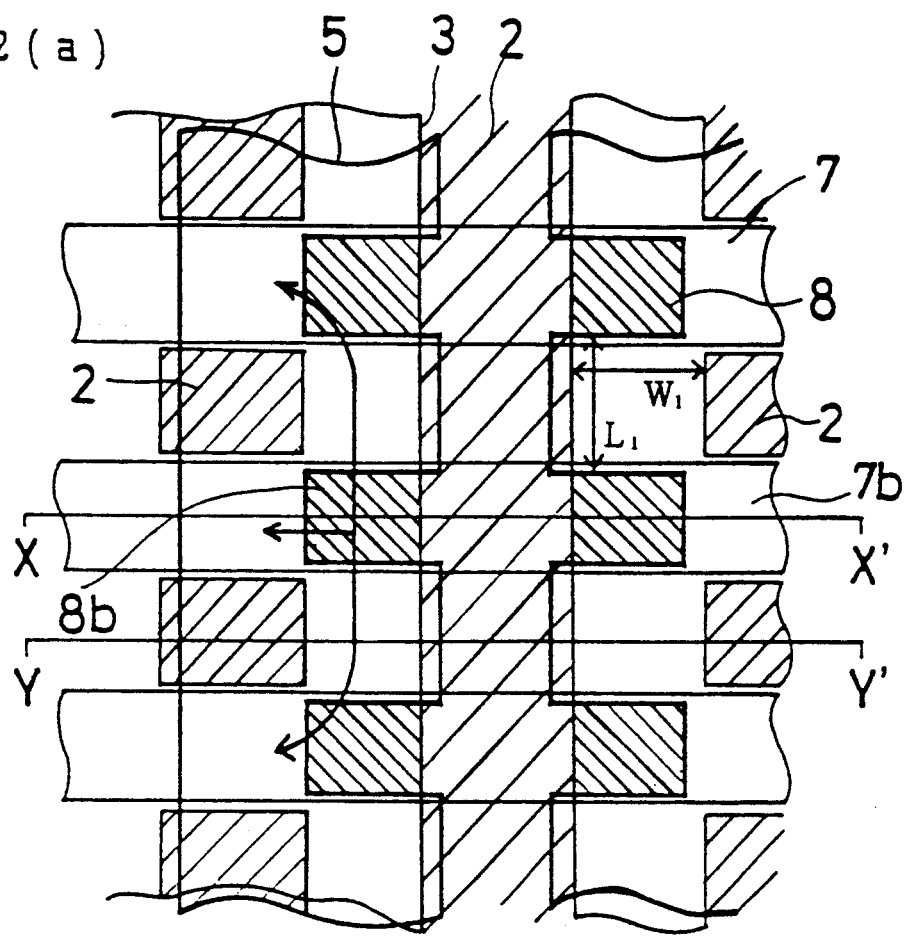
FIG. 2 (a) is a plan view showing an embodiment of a non-volatile memory of the invention, FIG. 2 (b) is a cross section taken along a X—X' line of FIG. 2 (a), FIG. 2 (c) is a cross section taken along a Y—Y' line of FIG. 2 (a).
Figure 2B:
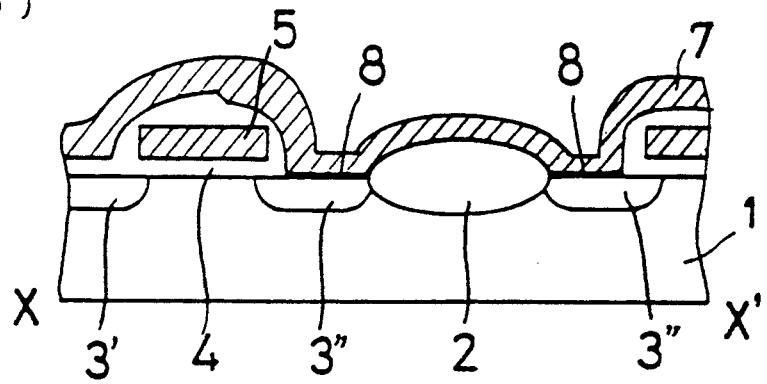
Figure 2C:
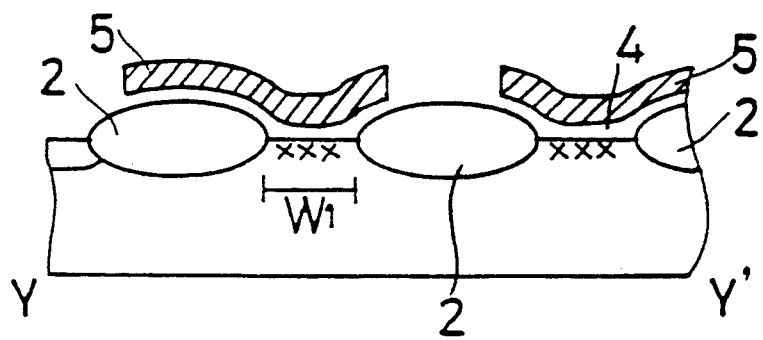
Figure 3A:
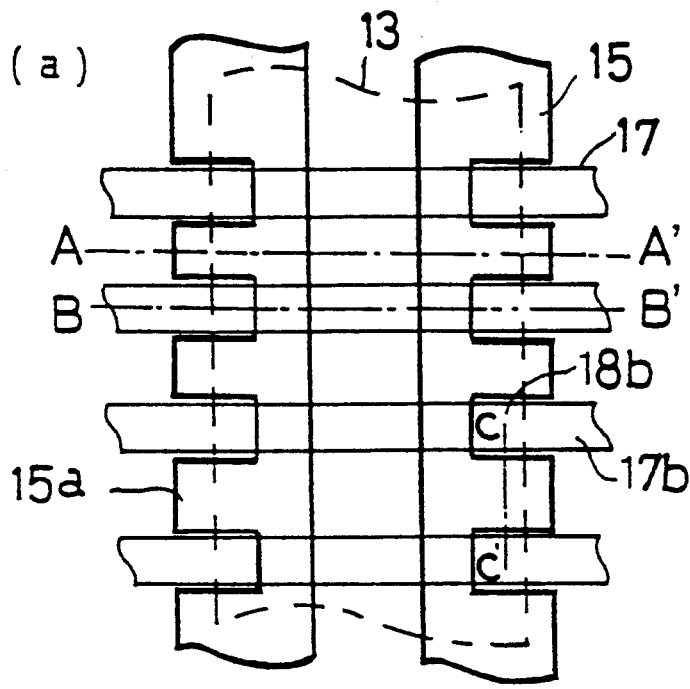
FIG. 3 (a) is a plan view showing another embodiment of a non-volatile memory of this invention, FIG. 3 (b) is a cross section taken along an A—A' line of FIG. 3 (a), FIG. 3 (c) is a cross section taken along a B—B' line of FIG. 3 (a), FIG. 3 (d) is a cross section taken along a C—C' line of FIG. 3 (a).
Figure 3B:
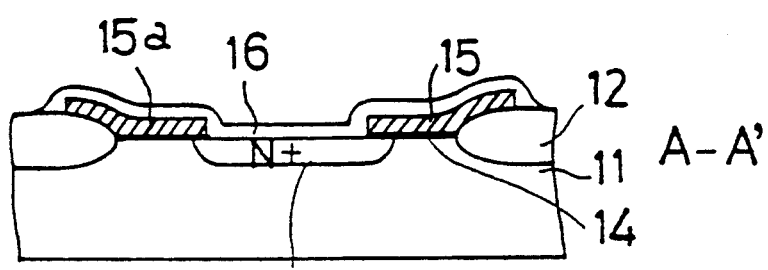
Figure 3C:
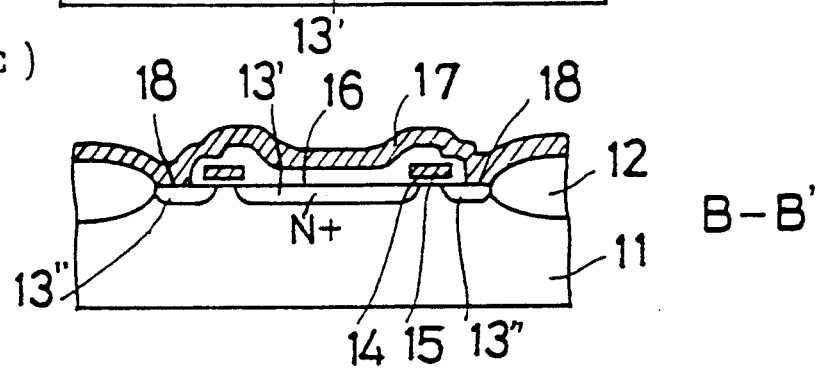
Figure 3D:
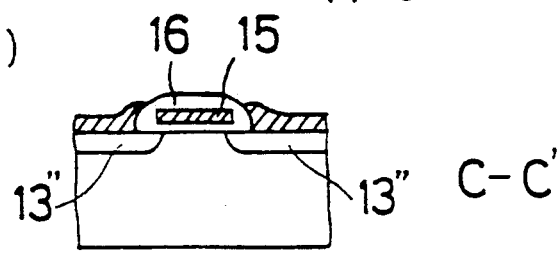

FIGS. 2 (a) through 2 (c) show a first embodiment of the non-volatile memory of this invention. A field oxide is firstly formed on a silicon substrate 1 to provide a device isolation region 2 and an active region 3. Subsequently an approximately 50 to 120 Å thick gate insulating film 4 is formed over the active region 3 by thermal oxidation of silicon.

Referring to FIG. 2 (a), on the silicon substrate 1, a gate electrode having an uneven configuration on one end is formed. Besides, on the silicon substrate 1, a source region 3' and a drain region 3" are formed. In a recessed portion of the gate electrode 5 on the drain region 3", an approximately 30 to 80 Å thick SiO$_2$ anti-fuse film 8 is formed. An electrode polysilicon layer 7 is formed as a bit line in the thickness of approximately 1000 to 6000 Å in such a manner that the layer 7 perpendicularly intersects the gate electrode 5 while overlaying the anti-fuse film 8.

The gate electrode 5 in the above non-volatile memory can be formed of any material that can be used for an ordinary electrode, but it is preferably formed of an approximately 1000 to 6000 Å thick polysilicon. Both the gate electrode 5 and the electrode polysilicon layer 7 can be formed with a known method, such as chemical vapor deposition (CVD) process. Besides, the source region and the drain region can be formed by ion implantation of approximately $1 \times 10^{15}$ to $1 \times 10^{18}$ ions/cm$^2$ of either arsenic or phosphorus at 40 to 80 Kev.

As shown in FIG. 2 (b), on a silicon substrate thus formed, a gate insulating film 4, a gate electrode 5, a source region 3' and a drain region 3" are formed in the non-volatile memory.

As shown in FIG. 2 (c), an auxiliary transistor is arranged between adjacent cells on the device isolation region 2 and the activated region 3. The gate electrode 5 acts as a word line for the auxiliary transistor, and it also acts for the select transistor. Therefore, in the cycle of writing in memory contents, applying a high voltage to the word line electrifies the auxiliary transistor, thereby allowing a large amount of electricity to pass therethrough. Ion implantation in the region below the gate electrode 5 in the auxiliary transistor and the region designated with L$_1$ and W$_1$ or the provision of thicker gate oxide film in the regions increases the threshold voltage V$_{th}$, thereby V$_{th}$ transistor the auxiliary transistor is provided as a high V$_{th}$ transistor which de-energizes in reading. Incidentally, in order to increase the threshold voltage V$_{th}$, such methods as ion implantation and thickening the gate oxide film in the region can be combined.

In the non-volatile memory shown in FIG. 2 (a), for example, the bit line 7b is selected to allow electric current to flow for writing in memory contents, thereby resulting in insulation breakdown of the fuse insulating film 8b. Consequently, as shown by an arrow, an adjacent select transistor is electrified through the auxiliary transistor.

EMBODIMENT 2

FIGS. 3 (a) through 3 (d) show a second embodiment of this invention. A field oxide is formed on a silicon substrate 11 to provide a device isolation region 12 and active region 13. Subsequently, an gate insulating film 14 is formed over the active region 13.

Referring to FIG. 3 (a), on the silicon substrate 11, a gate electrode 15 with an uneven pattern on one side thereof is formed. Besides, on the substrate 11, a source region 13' and a drain region 13" are also formed. An anti-fuse film 18 is formed on the drain region 13" in the recessed portion of the gate electrode 15.

An electrode polysilicon layer 17 is formed as a bit line in such a manner that the layer perpendicularly intersects the gate electrode 15 while overlaying the anti-fuse film 18. Besides, select transistors sharing a word line 15 and those sharing a word line 15a adjacent to the word line 15 share a source region 13'.

Referring to FIG. 3 (c). in a non-volatile memory thus formed, a gate insulating film 14, a gate electrode 15, a source region 13' and a drain region 13" are formed to constitute a select transistor.

Referring to FIG. 3 (d), an auxiliary transistor is formed on a device isolation region 12 and an activated region 13 between adjacent transistors. A word line in the auxiliary transistor constitutes a gate electrode 15, which also acts as a gate electrode 15 for the select transistor. Thus, selecting a predetermined word line and a bit line in writing in memory contents into the memory cells allow electric current to flow through the memory cell adjacent to the longitudinal direction of the word line.

In the non-volatile memory shown in FIG. 3 (a), a memory cell is selected by energizing both a word line (gate electrode 15) and a bit line 17. When no voltage is applied to the word line 15, the select transistor is turned off. Auxiliary transistors adjacent to the select transistor are also turned off. Consequently, each cell is separate. When voltage is applied to the word line 15 to turn on the select transistor as well as the auxiliary transistors adjacent to the select transistor simultaneously and then voltage is applied to a bit line 17b, an anti-fuse film 18b is broken down to allow electric current to flow from the bit line 17 to a common source 13'. In this process, not only the select transistors in the selected cells but also adjacent select transistors are electrified from the select transistors through the auxiliary transistors. This will result in an ostensible increase in the ON current in the select transistors. Thus, without enlarging the cell size, reading electric current and writing in electric current can be increased.

EMBODIMENT 3

Figure 4:
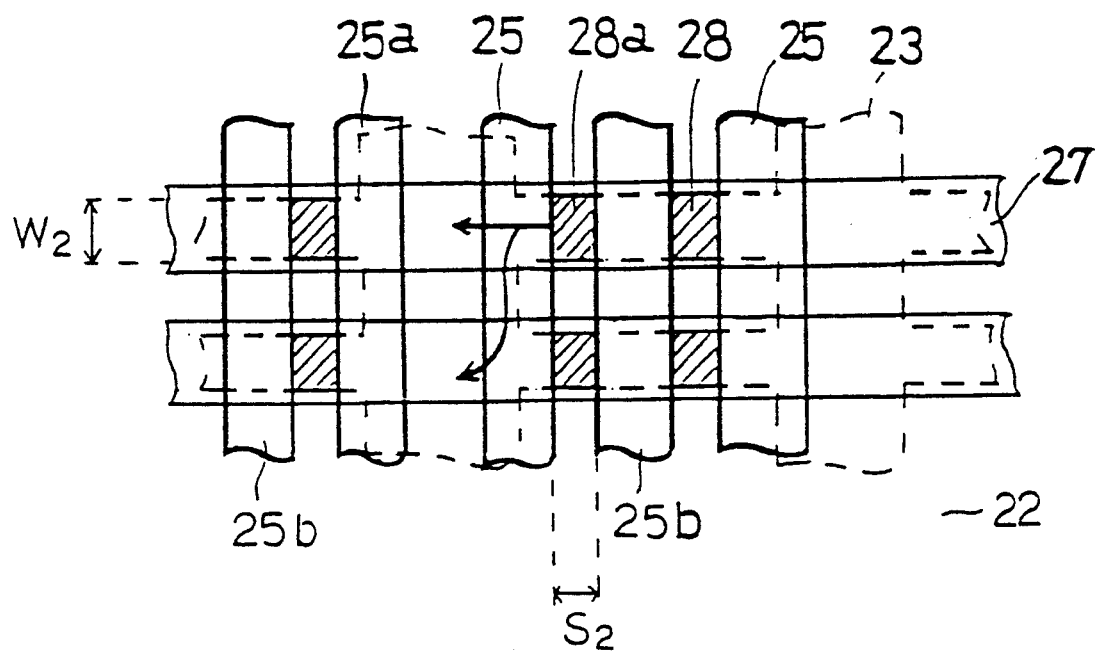
FIG. 4 is a plan view showing another embodiment of the non-volatile memory of the invention, FIG. 5 (a) is a plan view showing a conventional non-volatile memory of this invention.

FIG. 4 shows a third embodiment of this invention. A field oxide is formed on a Silicon substrate to provide a device isolation region 22 and an active region 23. On the active region 23, a gate insulating film (not shown in the drawings) is formed. On the silicon substrate, many word lines (a gate electrode 25) are formed. Then, select transistors sharing one word line (the gate electrode 25) and different select transistors sharing different word lines 25a adjacent to said word lines (the gate electrode 25) share a source region (not shown in the drawing). Another different word lines 25b adjacent to the word lines and disposed opposite to the word lines 25a are formed line for use in device isolation. Then an anti-fuse film 28 is formed between the two word lines 25, 25b or the different two word lines 25a and 25b. Besides, an electrode polysilicon layer 27 is formed as a bit line in such a manner that the layer 27 perpendicularly intersects the gate electrode 25 and overlays the anti-fuse film 28.

In such a non-volatile memory, a device isolation gate electrode 25b is provided between the pair of word lines 25 as well as between the pair of word lines 25a, and an anti-fuse film 28 is provided between the two word lines 25, 25a and a gate electrode 25b (no voltage applied at all times) for device isolation. Consequently, the width of the anti-fuse film 28 is defined with the space between the gate electrode 25. In other words, the area of the anti-fuse film 28 depends on the width $W_2$ of the active region 23 and on a space $S_2$ between the gate electrodes 25, 25b or 25a, 25b to be definite irrespective of the displaced alignment of the word lines. Thus, even a displaced alignment of the word lines does not change the area of the anti-fuse film 28.

In the non-volatile memory shown in FIG. 4, cells are selected by energizing both a word line (gate electrode 25) and a bit line 27. When no voltage is applied to the word line 25, the select transistor is de-energized. Then an auxiliary transistors adjacent to the cell transistor are also de-energized. Energizing the word line 25 electrifies a common select transistors. In this process, energizing the bit line 27 breaks down the anti-fuse film 28a to allow electric current to flow from the bit line 27 to the common source. This will result in an ostensible increase in the ON current in the select transistor. Consequently, without enlarging the physical size of cells, reading currents and writing in currents can also increase.

According to the present invention, forming a necessary portion of cell blocks allows writing in and reading a voluntary bit of memory contents. There is also provided a non-volatile memory free from a reduction in dielectric strength, which device can decrease resistance generated in a cycle of reading and writing in memory contents without enlarging the memory size.

What is claimed is:

1. A non-volatile programmable memory having:
   a plurality of unit cells disposed therein, each of said unit cells including an anti-fuse that can write in data by electrically breaking down an insulating film of the anti-fuse, a select transistor individually connected to said anti-fuse, and a wiring connected to each of anti-fuse; and
   an auxiliary transistor connected between mutually adjacent unit cells, said auxiliary transistor having a source region and a drain region respectively connected between said anti-fuse and said select transistor together incorporated in mutually adjacent unit cells.

2. A non-volatile programmable memory of claim 1, wherein both the select transistor and the auxiliary transistor respectively comprise a gate electrode, said electrodes of both being formed on an identical conductive layer.

* * * * *